United States Patent
Fransen et al.

(10) Patent No.: US 12,463,066 B2
(45) Date of Patent: Nov. 4, 2025

(54) SYSTEMS FOR STRETCHING A DIE SOURCE, AND RELATED METHODS

(71) Applicant: Kulicke & Soffa Netherlands B.V., Eindhoven (NL)

(72) Inventors: Hendrikus Antonius Fransen, Budel-Schoot (NL); René Christoffel Bouman, Vught (NL)

(73) Assignee: Kulicke & Soffa Netherlands B.V., Eindhoven (NL)

( * ) Notice: Subject to any disclaimer, the term of this patent is extended or adjusted under 35 U.S.C. 154(b) by 355 days.

(21) Appl. No.: 18/092,907

(22) Filed: Jan. 3, 2023

(65) Prior Publication Data

US 2024/0222164 A1 Jul. 4, 2024

Related U.S. Application Data

(60) Provisional application No. 63/296,200, filed on Jan. 4, 2022.

(51) Int. Cl.
*H01L 21/67* (2006.01)

(52) U.S. Cl.
CPC .......... *H01L 21/67132* (2013.01); *H01L 2221/68336* (2013.01)

(58) Field of Classification Search
CPC ............ H01L 21/6835; H01L 21/6836; H01L 2221/683; H01L 2221/68336; H01L 21/67132; B23P 15/50; B23P 11/00; B23P 11/02
See application file for complete search history.

(56) References Cited

U.S. PATENT DOCUMENTS

| | | | |
|---|---|---|---|
| 5,901,599 A * | 5/1999 | Sato | B21D 22/22 72/350 |
| 7,825,010 B2 | 11/2010 | Clawson | |
| 8,936,969 B2 | 1/2015 | Lee et al. | |
| 10,008,405 B2 | 6/2018 | Iwanaga et al. | |

FOREIGN PATENT DOCUMENTS

KR 102322527 10/2015

OTHER PUBLICATIONS

Screen Captures from YouTube Video Clip Entitled "Die Matrix Expander TEX-218 Tutorial".
Screen Captures from Webpage Video Clip Entitled "Model 1810 Die Matrix Expander".

* cited by examiner

*Primary Examiner* — Christopher J. Besler
(74) *Attorney, Agent, or Firm* — Christopher M. Spletzer, Sr.

(57) ABSTRACT

A system for stretching a die source is provided. The system includes: a stretch ring for holding a carrier sheet, the carrier sheet supporting a die source, the die source including a plurality of die; and a driving member for contacting the carrier sheet through the stretch ring, an area occupied by the die source being increased by contact between the driving member and the carrier sheet. At least one of (a) a cross section of the driving member, and (b) an internal shape of the stretch ring, is non-circular.

10 Claims, 7 Drawing Sheets

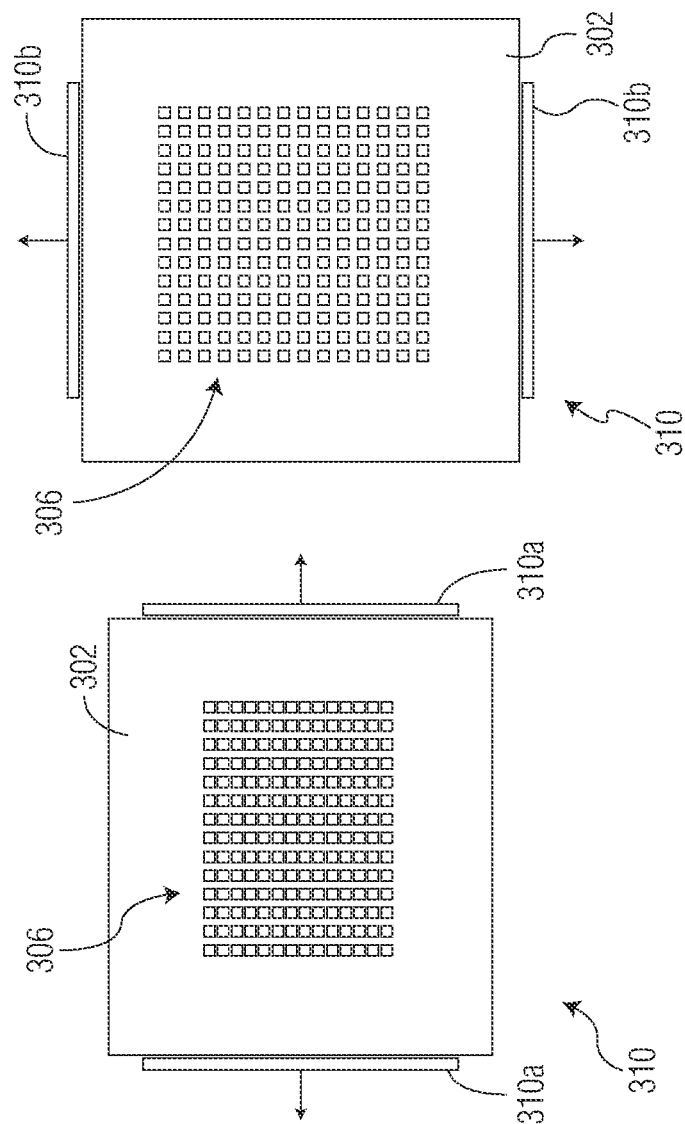
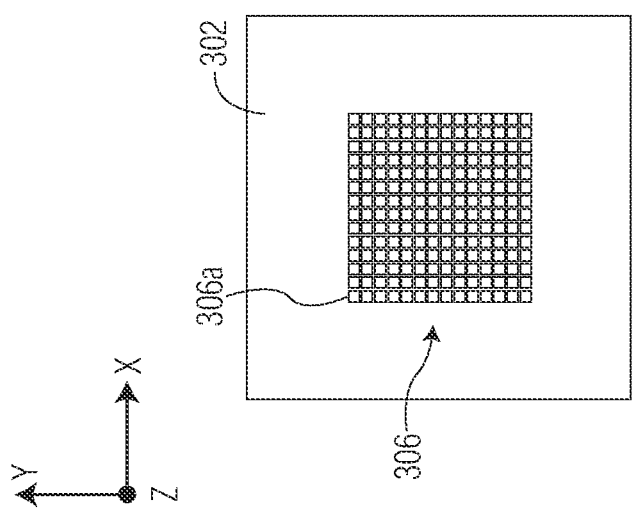
FIG. 3A    FIG. 3B    FIG. 3C

SYSTEMS FOR STRETCHING A DIE SOURCE, AND RELATED METHODS

CROSS-REFERENCE TO RELATED APPLICATION

This application claims the benefit of U.S. Provisional Application No. 63/296,200, filed Jan. 4, 2022, the content of which is incorporated herein by reference.

FIELD

The invention relates to systems and methods for stretching a die source, and in particular, to improved systems and methods for providing a desired configuration of the die source (e.g., the area of the die source shape) on a carrier sheet.

BACKGROUND

In semiconductor packaging and related fields, electronic components (e.g., semiconductor die, LED die, etc.) are transferred from a die source (e.g., a semiconductor wafer) to a substrate. Conventional technologies for such transfer include pick and place transfer, pin-based transfer, laser-based transfer, etc.

Prior to the transfer of components from the die source (e.g., a plurality of LED die on a carrier sheet, a semiconductor wafer on a carrier sheet, etc.), the die source may be provided in a circular configuration (i.e., the die may be arranged in a circular pattern on the carrier sheet). In such a case, the die source may be supported by a circular stretch ring. Before transfer of the components (e.g., by a pick and place process, etc.), a circular driving member may be used to press against the carrier sheet to expand the area occupied by the die source. Such a technique tends to make transfer of the individual die easier because of increased spacing between adjacent ones of the die.

If a die source is provided having a rectangular (e.g., square) configuration (e.g., see FIGS. 1A-1B), the contact with a circular driving member may stretch the die source in an inconsistent and/or undesirable shape (e.g., see the barrel shape of the die source shown in FIGS. 2A-2B).

Thus, it would be desirable to provide improved systems for stretching a die source, and related methods.

SUMMARY

According to an exemplary embodiment of the invention, a system for stretching a die source is provided. The system includes: a stretch ring for holding a carrier sheet (e.g., a flexible film, a foil, etc.), the carrier sheet supporting a die source, the die source including a plurality of die; and a driving member for contacting the carrier sheet through the stretch ring, an area occupied by the die source being increased by contact between the driving member and the carrier sheet. At least one of (a) a cross-section of the driving member, and (b) an internal shape of the stretch ring, is non-circular.

According to another exemplary embodiment of the invention, a system for stretching a die source is provided. The system includes: a stretch ring for holding a carrier sheet (e.g., a flexible film, a foil, etc.), the carrier sheet supporting a die source, the die source including a plurality of die, the plurality of die being arranged in a substantially rectangular (e.g., square) configuration on the carrier sheet; and a driving member for contacting the carrier sheet through the stretch ring, an area occupied by the die source being increased by contact between the driving member and the carrier sheet, wherein at least one of (a) a cross-sectional shape of the driving member, and (b) an internal shape of the stretch ring is configured to assist in maintaining the substantially rectangular configuration after the area occupied by the die source is increased by the contact between the driving member and the carrier sheet.

According to yet another exemplary embodiment of the invention, a system for stretching a die source is provided. The system includes a stretching mechanism for holding a carrier sheet (e.g., a flexible film, a foil, etc.), the carrier sheet supporting a die source, the die source including a plurality of die, the plurality of die being arranged in a substantially rectangular (e.g., square) configuration on the carrier sheet. The stretching mechanism is configured to stretch the carrier sheet in a first direction and a second direction.

According to additional exemplary embodiments of the invention, methods of stretching a die source are provided. Exemplary methods include those described in the preceding three paragraphs, and also throughout the application.

Certain exemplary methods include: providing a die source including a plurality of die, the plurality of die being arranged in a substantially rectangular (e.g., square) configuration on a carrier sheet; holding the carrier sheet with stretch ring; and stretching the carrier sheet using a driving member contacting the carrier sheet. At least one of (a) a cross-section of the driving member, and (b) an internal shape of the stretch ring, is non-circular.

Other exemplary methods include: providing a die source including a plurality of die, the plurality of die being arranged in a substantially rectangular (e.g., square) configuration on a carrier sheet; holding the carrier sheet with stretch ring; and stretching the carrier sheet using a driving member contacting the carrier sheet. At least one of (a) a cross-sectional shape of the driving member, and (b) an internal shape of the stretch ring, is configured to assist in maintaining the substantially rectangular configuration after the area occupied by the die source is increased by the contact between the driving member and the carrier sheet.

Other exemplary methods include: providing a die source including a plurality of die, the plurality of die being arranged in a substantially rectangular (e.g., square) configuration on a carrier sheet; holding the carrier sheet using a stretching mechanism; and stretching the carrier sheet in a first direction and a second direction.

Other features disclosed throughout the application are applicable to the aforementioned methods.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIGS. 3A-3C are block diagram top views of a die source on a carrier sheet, and system for stretching the die source, in accordance with an exemplary embodiment of the invention;

DETAILED DESCRIPTION

Figure 1A:
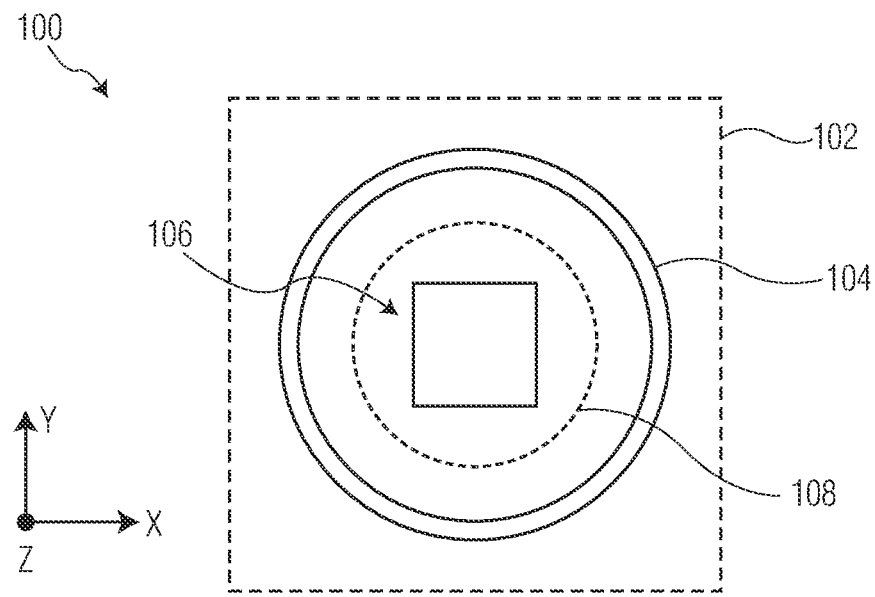
FIGS. 1A-1B are top and side block diagram views of a system for stretching a die source, prior to stretching of the die source, in accordance with an exemplary embodiment of the invention.
Figure 1B:
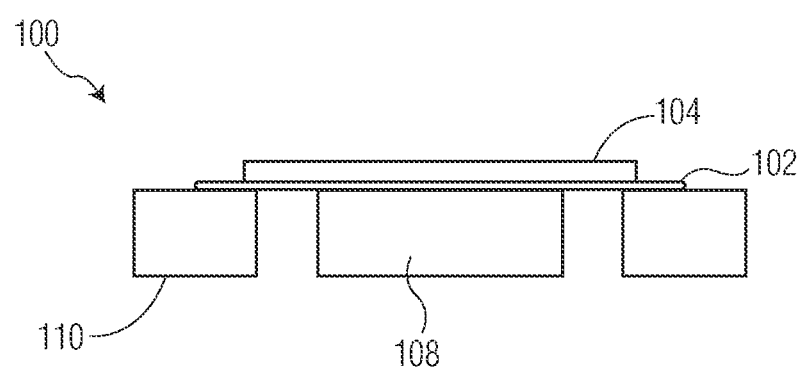

In accordance with various exemplary embodiments of the invention, systems (and methods) are provided for more evenly stretching a carrier sheet (e.g., a flexible film, a foil, etc.) that carries an array of electronic components (e.g., a die source) in a rectangular shaped area. For example, the carrier sheet may be sheet material that is flexible and sticky.

For example, methods of sustaining a rectangular shape of an array of electronic components (e.g., a plurality of die, such as a plurality of semiconductor die or a plurality of LED die) is provided. The array (e.g., the plurality of die) is supported on a carrier sheet (e.g., a flexible film, a foil, etc.)—and the carrier sheet is stretched. Various systems, and methods, may be used for maintaining a rectangular shape of the array after the stretching such as: a stretching mechanism (e.g., an X-Y stretcher tool); a system including a driving member having a non-circular cross section; a system including a stretch ring having a non-circular internal shape; among others.

After stretching of the carrier sheet, the array of electronic components may be "locked" in the stretched configuration using a stretch ring or the like. Then, the array of electronic components may be transferred (e.g., one by one, or a plurality of components at the same time) from the array to one or more substrates. The transfer of the electronic components may be accomplished on the same machine that performs the "stretching" of the carrier sheet; however, it is understood that in many applications the array of electronic components (carried by the stretch ring in the stretched configuration) may be moved to another piece of equipment for the transfer of the electronic components.

For improved efficiency in later manufacturing stages, the components of a die source (e.g., semiconductor die, LED die such as in mini or micro LED applications, or other components), may be arranged in a straight rectangular grid with a certain gap between the components. Conventional radial stretching methods may result in a grid area having an undesirable grid shape (e.g., a barrel shaped die source, etc.). Exemplary techniques for overcoming such problems include: (i) stretching the carrier sheet with a non-radial stretching mechanism (e.g., that can independently stretch a carrier sheet along the X and Y directions such as in FIGS. 3B-3C and FIG. 4) (e.g., an X-Y stretcher tool); (ii) stretching the carrier sheet with a modified radial stretcher device that induces different level of stretch force/rate over various sections of the circumference (e.g., FIGS. 5A-5B, FIG. 6, and FIGS. 7A-7B). Such modified radial stretcher devices may include, for example, a driving member having a non-circular cross section and/or a stretch ring having a non-circular internal shape.

Using the inventive systems for stretching a die source (and/or related methods), location specific levels of stretch force and/or location specific directions of stretch force may be induced. Thus, improved input materials (e.g., die sources) may be provided for more efficient and accurate production processes.

Figure 2A:
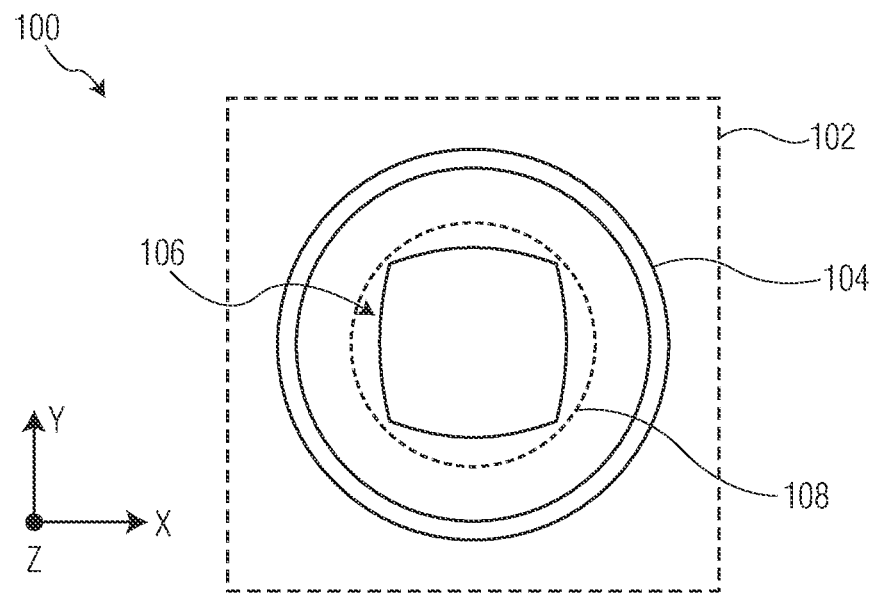
FIGS. 2A-2B are top and side block diagram views of the system of FIGS. 1A-1B, after stretching of the die source, in accordance with an exemplary embodiment of the invention.
Figure 2B:
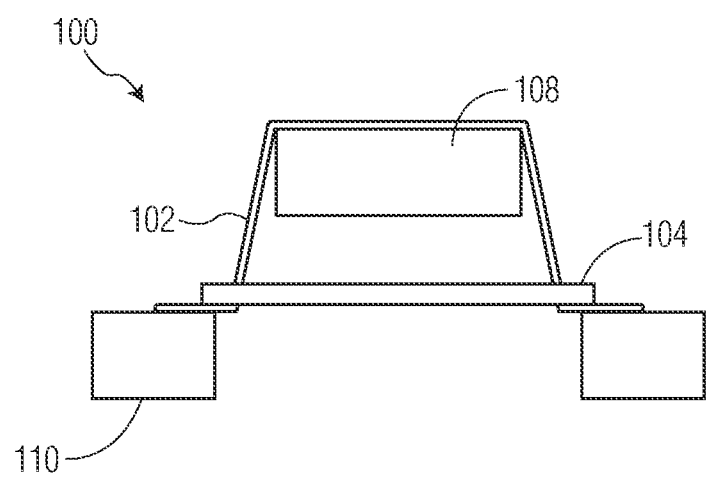

Referring now to the drawings, FIGS. 1A-1B and 2A-2B illustrate a system 100 for stretching a die source 106. System 100 includes a stretch ring 104 for holding a carrier sheet 102. Carrier sheet 102 supports die source 106. System 100 also includes a driving member 108 and a support structure 110. In the example shown in FIGS. 1A-1B and 2A-2B, driving member 108 has a conventional circular cross section. Support structure 110 supports stretch ring 104 (as well as supporting carrier sheet 102 and die source 106), while driving member 108 moves to contact (and stretch) carrier sheet 102 through stretch ring 104 (see FIG. 2B). Through this stretching of carrier sheet 102, the area occupied by die source 106 is increased. However, as shown in FIG. 2A, the stretched die source 106 no longer has a rectangular shape but rather has a distorted "barrel" shape.

Figure 4:
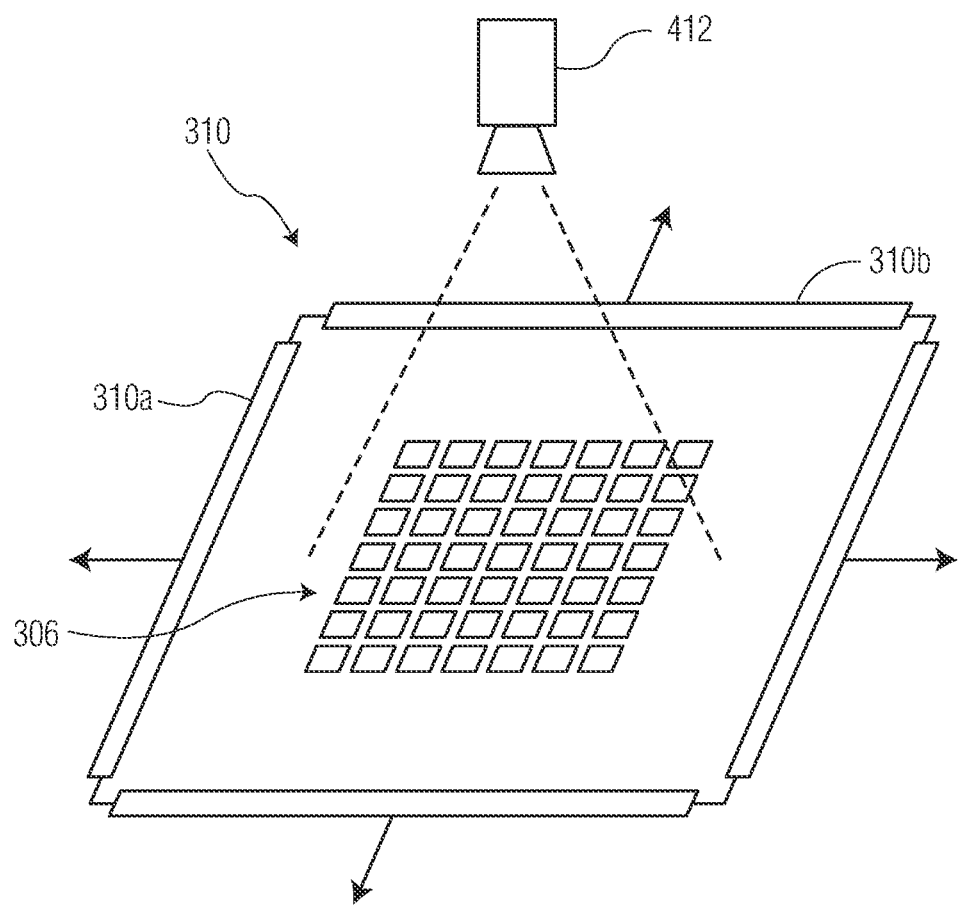
FIG. 4 is a block diagram top perspective view of elements of the system for stretching the die source of FIGS. 3A-3C, with additional elements.
Figure 5A:
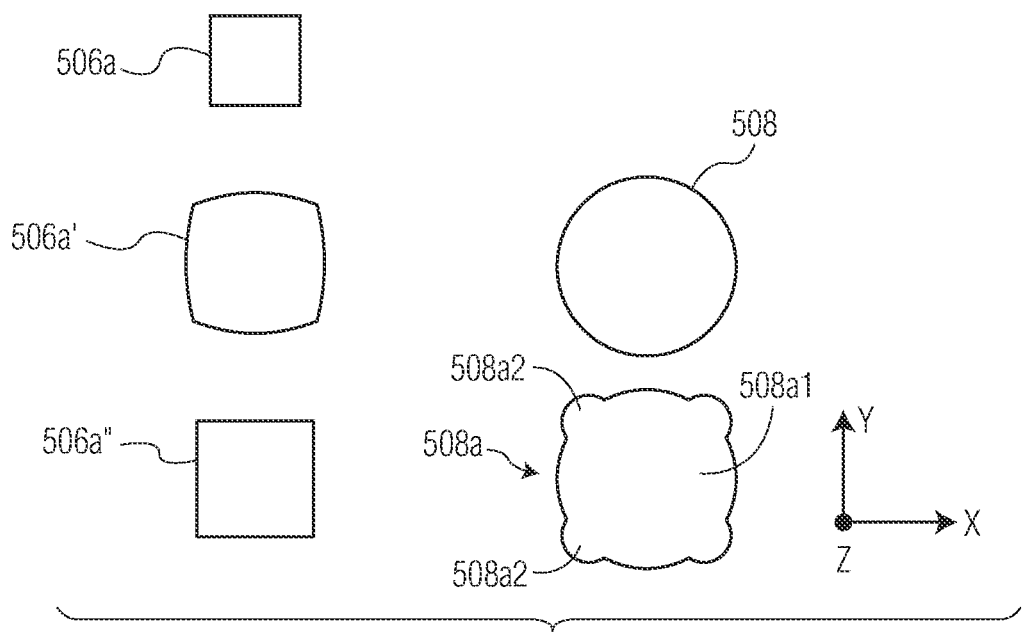
FIG. 5A is a block diagram top view illustrating a die source prior to stretching, after stretching with a driving member with a circular cross section, and after stretching with a driving member with a non-circular cross section, in accordance with an exemplary embodiment of the invention.
Figure 5B:
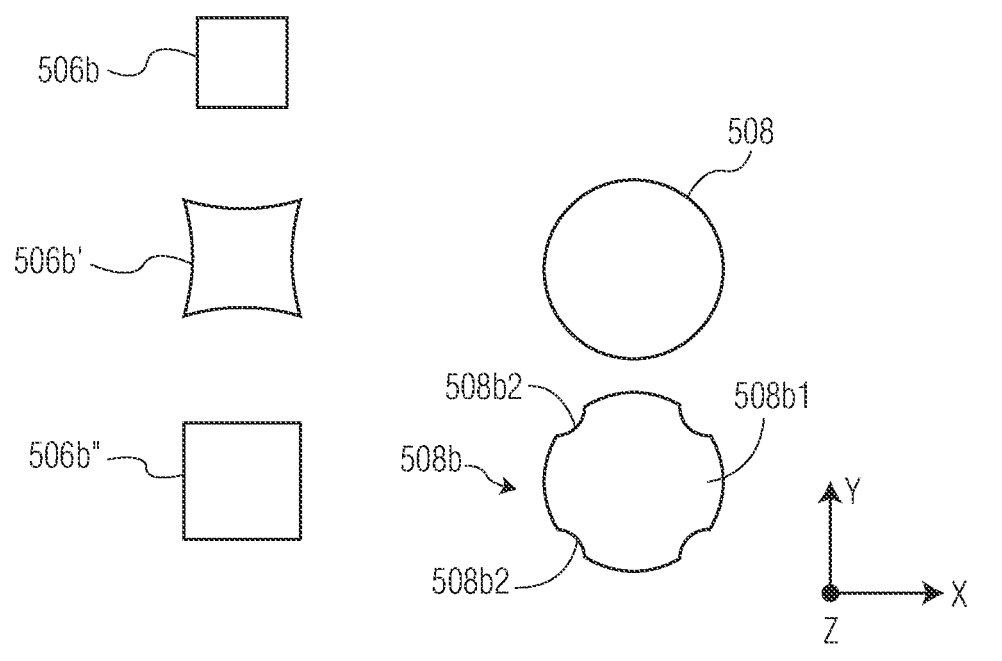
FIG. 5B is another block diagram top view illustrating a die source prior to stretching, after stretching with a driving member with a circular cross section, and after stretching with a driving member with a non-circular cross section, in accordance with another exemplary embodiment of the invention.
Figure 6:
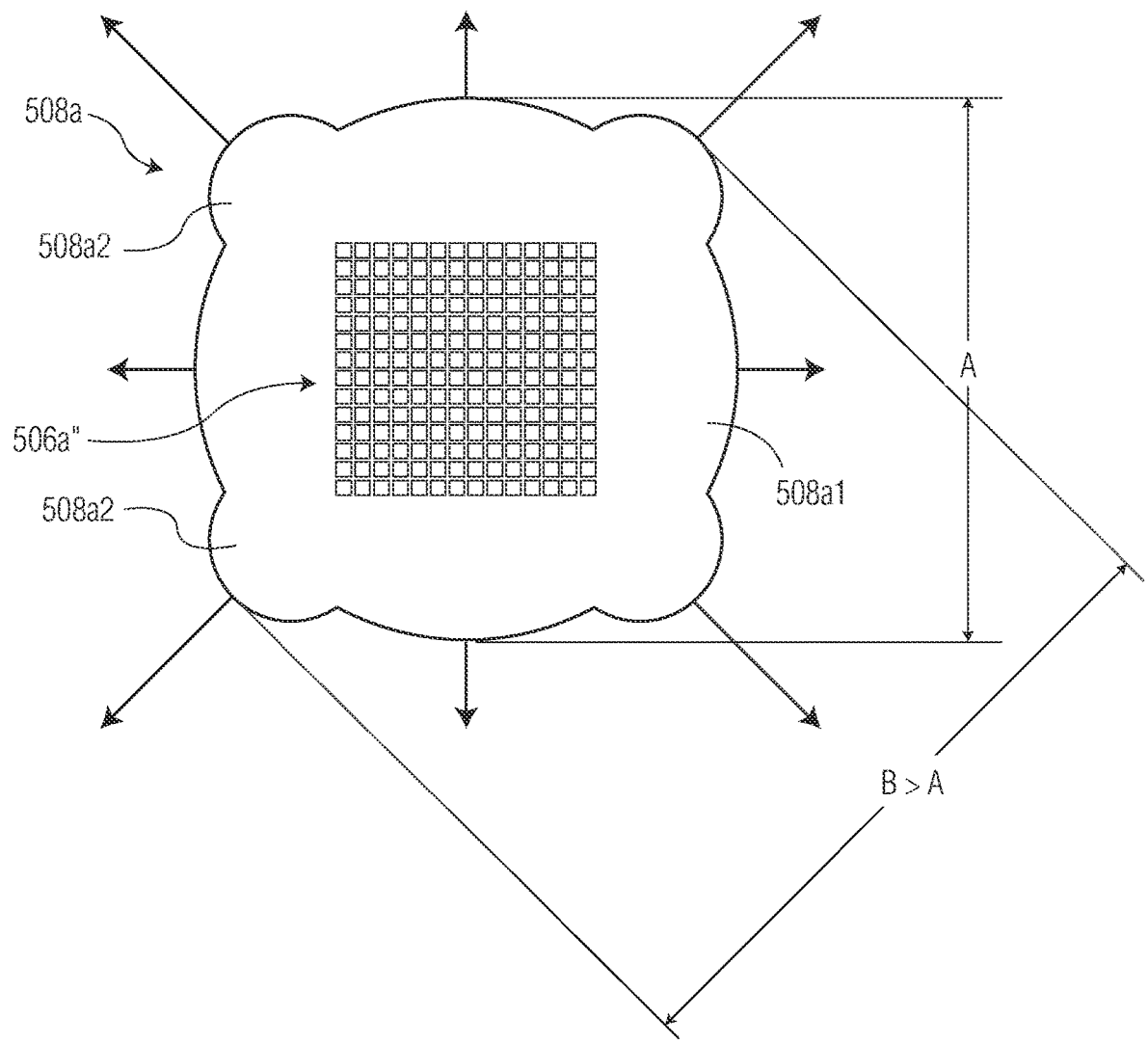
FIG. 6 is a block diagram top view of the driving member with a non-circular cross section of FIG. 5A, contacting a die source on a flexible film, in accordance with an exemplary embodiment of the invention.
Figure 7A:
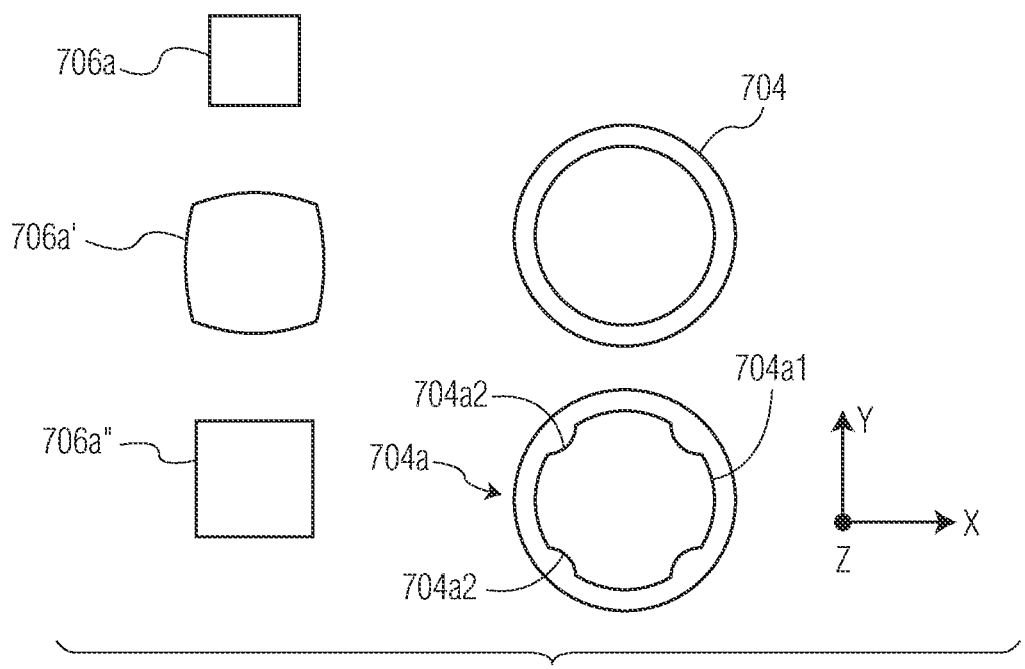
FIG. 7A is a block diagram top view illustrating a die source prior to stretching, after stretching with a stretch ring having a circular internal shape, and after stretching with a stretch ring having a non-circular internal shape, in accordance with an exemplary embodiment of the invention.
Figure 7B:
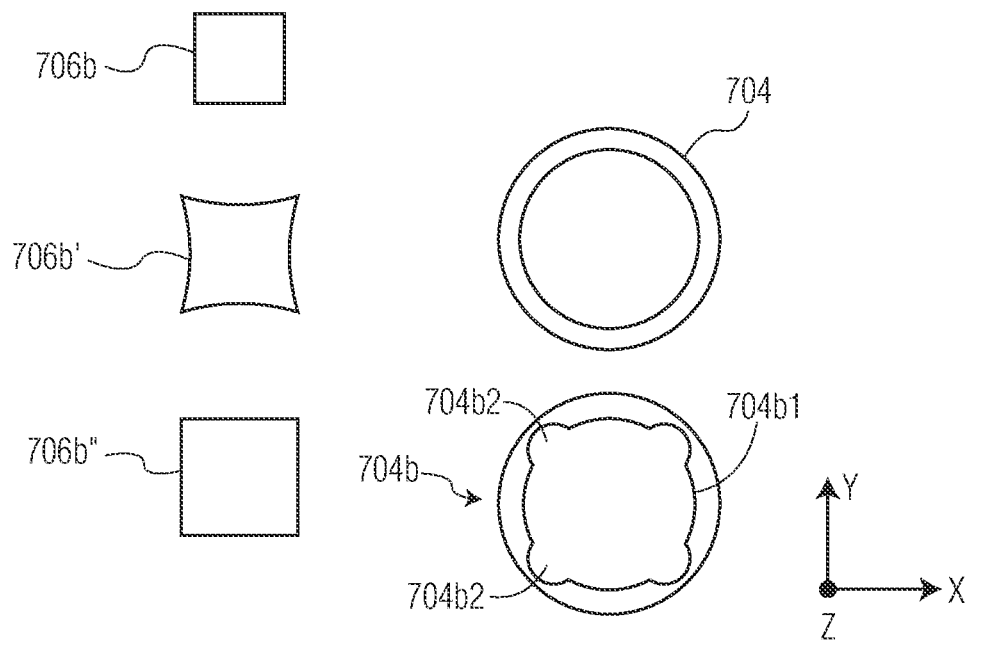
FIG. 7B is another block diagram top view illustrating a die source prior to stretching, after stretching with a stretch ring having a circular internal shape, and after stretching with a stretch ring having a non-circular internal shape, in accordance with another exemplary embodiment of the invention.

Aspects of the invention are directed at overcoming problems such as that illustrated in FIGS. 1A-1B and 2A-2B (e.g., a circular driving member stretching a rectangular shaped die source such that the die source no longer has a rectangular shape). FIGS. 3A-3C and FIG. 4 illustrate one type of solution. FIGS. 5A and 6 illustrate another type of solution. FIG. 5B illustrates yet another type of solution. FIG. 7A illustrates yet another type of solution. FIG. 7B illustrates yet another type of solution.

Referring now to FIG. 3A-3C, a die source 306 includes a plurality of die 306a in a rectangular configuration (in FIGS. 3A-3C, the die are arranged in a "grid" pattern—with equal spacing between ones of the plurality of die in both the x and y directions). Die source 306 is supported by a carrier sheet 302 (e.g., a flexible film 302). FIGS. 3B-3C illustrate a stretching mechanism 310 for holding carrier sheet 302. Stretching mechanism 310 (including actuators 310a and 310b) is configured to stretch carrier sheet 302 in a first direction (e.g., the x-axis direction shown in FIG. 3B) and a second direction (e.g., the y-axis direction shown in FIG. 3C). In the example shown in FIGS. 3A-3C, the first direction and the second direction are substantially perpendicular to one another. Further, in the example shown in FIGS. 3A-3C, the first direction and the second direction are substantially parallel to a plane of carrier sheet 302.

More specifically, FIG. 3B illustrates carrier sheet 302 having been stretched in the x-axis direction with actuator(s)

310a of stretching system 310 (in FIG. 3B actuator(s) 310b have been removed for simplicity). Having been stretched along the x-axis in FIG. 3B, there is no longer equal spacing between ones of the plurality of die of die source 306 in both the x and y directions. However, FIG. 3C illustrates carrier sheet 302 having been stretched in the y-axis direction with actuator(s) 310b of stretching system 310 (in FIG. 3C actuator(s) 310a have been removed for simplicity). Having now been stretched along the x-axis in FIG. 3B, and along the y-axis in FIG. 3C, in FIG. 3C there is again equal spacing between ones of the plurality of die of die source 306 in both the x and y directions. Although FIGS. 3B and 3C illustrate the stretching done in the x-axis direction and the y-axis direction as distinct steps, it is understood that the stretching may be done at one time, or iteratively, as desired.

In order that the stretching process of FIGS. 3B-3C (or another stretching process within the scope of the invention) be efficient, monitoring and/or controlling the process would be desirable. FIG. 4 illustrates the stretching mechanism 310 of FIGS. 3B-3C in a perspective view, with an overhead imaging system 412. In FIG. 4, die source 306 has been simplified (with less individual die) for ease of illustration. Imaging system 412 may image die source 306 (and/or a portion of die source 306) in order to determine if the stretching process has been successful and/or to control the stretching process. For example, imaging system 412 (e.g., a camera, operable with image processing software and a computer) may detect if the spacing of the various die of die source 306 is equal (or substantially equal, based on some predetermined criteria) in both the x and y directions, or if additional stretching (in one or both directions) is desired.

Thus, imaging system 412 is an example of a monitoring device for optimizing the stretching of a carrier sheet in a closed loop manner. Such a monitoring device may operate in connection with an automated drive system (e.g., including the various actuators illustrated in FIGS. 3A-3C and FIG. 4) for stretching the flexible film in the first direction and the second direction.

As provided above, aspects of the invention relate to modified radial stretcher devices, for example, including a driving member having a non-circular cross section (as described below in connection with FIGS. 5A-5B and FIG. 6) and/or a stretch ring having a non-circular internal shape (as described below in connection with FIGS. 7A-7B). The descriptions below of FIGS. 5A-5B, FIG. 6, and FIGS. 7A-7B are intended as part of a system for stretching a die source such as shown in FIGS. 1A-1B and FIGS. 2A-2B, with the modifications as described herein. For example, FIGS. 1A-1B and FIGS. 2A-2B relate to a die source 106 having a rectangular (e.g., square) shape; likewise the die sources 506a, 506b in FIGS. 5A-5B, and the die sources 706a, 706b in FIGS. 7A-7B, have a rectangular shape. For example, FIGS. 1A-1B and FIGS. 2A-2B relate to a driving member 108 having a circular cross section; however, in FIGS. 5A-5B, driving members 508a, 508b have a non-circular cross section (in FIGS. 7A-7B the driving member is not illustrated, but may have a circular cross section). For example, FIGS. 1A-1B and FIGS. 2A-2B relate to a stretch ring 104 having a circular internal shape; however, in FIGS. 7A-7B, stretch rings 704a, 704b have a non-circular cross section (in FIGS. 5A-5B the stretch ring is not illustrated, but may have a circular internal shape).

FIG. 5A illustrates: a die source 506a (e.g., including a plurality of die, such as die source 306 shown in FIG. 3A) having a rectangular configuration prior to stretching (the upper image); the die source 506a (now labelled as stretched die source 506a') after stretching with a driving member 508 with a circular cross section (the center image) (where the die source now has a "barrel" shape, that is, non-rectangular); and the die source 506a (now labelled as stretched die source 506a") after stretching with a driving member 508a with a non-circular cross section (the lower image) (where the die source now has a "rectangular" shape, as with the upper image, but now stretched).

Driving member 508a of the lower image has a cross sectional shape that includes (i) a base shape 508a1, and (ii) four corner extensions 508a2 to the base shape 508a1. The exemplary base shape 508a1 of the driving member 508a is circular, with the four corner extensions 508a2 providing the driving member 508a with a non-circular cross section. In another example (not shown), the base shape of the driving member may be rectangular.

FIG. 5B illustrates: a die source 506b (e.g., including a plurality of die, such as die source 306 shown in FIG. 3A) having a rectangular configuration prior to stretching (the upper image); the die source 506b (now labelled as stretched die source 506b') after stretching with a driving member 508 with a circular cross section (the center image) (where the die source now has a "pincushion" shape, that is, non-rectangular); and the die source 506b (now labelled as stretched die source 506b") after stretching with a driving member 508b with a non-circular cross section (the lower image) (where the die source now has a "rectangular" shape, as with the upper image, but now stretched).

Driving member 508b of the lower image has a cross sectional shape that includes (i) a base shape 508b1, and (ii) four corner depressions 508b2 to the base shape 508b1. The exemplary base shape 508b1 of the driving member 508b is circular, with the four corner depressions 508b2 providing the driving member 508b with a non-circular cross section. In another example (not shown), the base shape of the driving member may be rectangular.

Thus, in each of the cases in FIGS. 5A-5B, it is clear that the rectangular (e.g., square) cross section of die source 506 is not maintained using a driving member having a circular cross section; however, a driving member having a non-circular cross section may be used to retain a rectangular (e.g., square) shape/configuration of die source 506 after stretching (e.g., radial stretching).

FIG. 6 is a detailed top view of driving member 508a (from the lower right image of FIG. 5A) with a non-circular cross section, having stretched the die source (labelled stretched die source 506a") on a carrier sheet (not shown, but see carrier sheet 102 from FIGS. 1A-1B and 2A-2B). As made clear in FIG. 6, the rectangular (e.g., square) shape/configuration of die source 506 is retained after stretching. For example, the spacing of the individual die is equal (e.g., substantially equal) along both the x-axis and the y-axis. FIG. 6 illustrates that the dimension "B" of driving member 508 across two of the corner extensions 508a2 is larger than the dimension "A" across the base shape 508a1.

While FIGS. 5A-5B and FIG. 6 provide certain exemplary driving members, with exemplary cross-sectional shapes, used to maintain the rectangular shape of the die source—the invention is not limited thereto. Any shaped driving member may be used to assist in maintaining the rectangular shape of the die source.

FIG. 7A illustrates: a die source 706a (e.g., including a plurality of die, such as die source 306 shown in FIG. 3A) having a rectangular configuration prior to stretching (the upper image); the die source 706a (now labelled as stretched die source 706a') after stretching by a driving member (not shown, but see FIGS. 1A-1B and FIGS. 2A-2B) while being supported by a stretch ring 704 having a circular internal shape (the center image) (where the die source now has a "barrel" shape, that is, non-rectangular); and the die source 706a (now labelled as stretched die source 706a") after stretching by a driving member (not shown, but see FIGS. 1A-1B and FIGS. 2A-2B) while being supported by a stretch ring 704a having a non-circular internal shape (the lower image) (where the die source now has a "rectangular" shape, as with the upper image, but now stretched).

The internal shape of stretch ring 704a of the lower image includes (i) a base shape 704a1, and (ii) four corner extensions 704a2 to the base shape 704a1. The exemplary base shape 704a1 of the stretch ring 704a is circular, with the four corner extensions 704a2 providing the internal shape to the stretch ring 704a to be non-circular. In another example (not shown), the base shape of the internal shape may be rectangular.

FIG. 7B illustrates: a die source 706b (e.g., including a plurality of die, such as die source 306 shown in FIG. 3A) having a rectangular configuration prior to stretching (the upper image); the die source 706b (now labelled as stretched die source 706b') after stretching by a driving member (not shown, but see FIGS. 1A-1B and FIGS. 2A-2B) while being supported by a stretch ring 704 having a circular internal shape (the center image) (where the die source now has a "pincushion" shape, that is, non-rectangular); and the die source 706b (now labelled as stretched die source 706b") after stretching by a driving member (not shown, but see FIGS. 1A-1B and FIGS. 2A-2B) while being supported by a stretch ring 704b having a non-circular internal shape (the lower image) (where the die source now has a "rectangular" shape, as with the upper image, but now stretched).

The internal shape of stretch ring 704b of the lower image includes (i) a base shape 704b1, and (ii) four corner depressions 704b2 to the base shape 704b1. The exemplary base shape 704b1 of the stretch ring 704b is circular, with the four corner depressions 704b2 providing the internal shape to the stretch ring 704b to be non-circular. In another example (not shown), the base shape of the internal shape may be rectangular.

While FIGS. 7A-7B provide certain exemplary stretch rings, with exemplary internal shapes, used to maintain the rectangular shape of the die source—the invention is not limited thereto. Any shaped stretch ring may be used to assist in maintaining the rectangular shape of the die source.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A system for stretching a die source, the system comprising:
   a stretch ring for holding a carrier sheet, the carrier sheet supporting a die source, the die source including a plurality of die; and
   driver for contacting the carrier sheet through the stretch ring, an area occupied by the die source being increased by contact between the driving member and the carrier sheet,
   wherein an internal shape of the stretch ring includes a circular base shape, and four inwardly protruding extensions from the circular base shape providing the internal shape of the stretch ring to be non-circular.

2. The system of claim 1 wherein the plurality of die are arranged in a substantially rectangular configuration on the carrier sheet, and wherein a cross sectional shape of the driver is configured to assist in maintaining the substantially rectangular configuration after the area occupied by the die source is increased by the contact between the driver and the carrier sheet.

3. The system of claim 1 wherein the plurality of die are LED die arranged on the carrier sheet.

4. The system of claim 1 wherein the driver has a circular cross section.

5. The system of claim 1 wherein the carrier sheet is a flexible film.

6. The system of claim 1 further comprising an overhead imaging system, the overhead imaging system being configured to image the die source.

7. The system of claim 6 wherein the imaging system is operable with image processing software and a computer.

8. The system of claim 7 wherein the imaging system detects the spacing of the plurality of die on the die source.

9. The system of claim 8 wherein the overhead imaging system is used to determine a success of a process of stretching the die source using the driver.

10. The system of claim 8 wherein the overhead imaging system is used to control a process of stretching the die source using the driver.

* * * * *